US008994451B1

(12) United States Patent
Wyse et al.

(10) Patent No.: US 8,994,451 B1
(45) Date of Patent: Mar. 31, 2015

(54) RF AMPLIFIER

(71) Applicants: Russell D. Wyse, Center Point, IA (US); Michael L. Hageman, Mt. Vernon, IA (US); Max S. Hawkins, Jr., Cedar Rapids, IA (US)

(72) Inventors: Russell D. Wyse, Center Point, IA (US); Michael L. Hageman, Mt. Vernon, IA (US); Max S. Hawkins, Jr., Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/833,893

(22) Filed: Mar. 15, 2013

Related U.S. Application Data

(63) Continuation of application No. 13/438,544, filed on Apr. 3, 2012.

(51) Int. Cl.
*H03F 3/45* (2006.01)
(52) U.S. Cl.
CPC .................................. *H03F 3/45076* (2013.01)
USPC ........................................ 330/252; 330/311
(58) Field of Classification Search
CPC ................................................... H03F 3/45076

USPC .................................... 330/252, 311, 261, 69
See application file for complete search history.

(56) References Cited

U.S. PATENT DOCUMENTS

| 6,100,759 A * | 8/2000 | Sirna et al. ..................... 330/252 |
| 6,366,166 B1 * | 4/2002 | Belot ............................. 330/252 |
| 7,119,615 B2 * | 10/2006 | Ten Dolle et al. ............. 330/252 |

OTHER PUBLICATIONS

Jiahui Yuan and John D. Cressler, "Enhancing the Speed of SiGe HBTs Using ft—Doubler Techniques", pp. 50-53.

* cited by examiner

*Primary Examiner* — Henry Choe
(74) *Attorney, Agent, or Firm* — Angel N. Gerdzhikov; Donna P. Suchy; Daniel M. Barbieri

(57) ABSTRACT

An RF amplifier suitable for use in an RF transceiver has a circuit including a first transistor pair with the collector of each coupled to one of the two differential output nodes and a common base. A pair of Ft doublers is provided with the emitter of each Ft doubler coupled to one of the transistors in the first transistor pair. Each Ft doubler has a common emitter and a base coupled to one of the differential input nodes. As such, the first transistor pair and the Ft doubler pair are cascode-coupled to provide a wide bandwidth, high gain, and high input impedance RF amplifier.

17 Claims, 4 Drawing Sheets

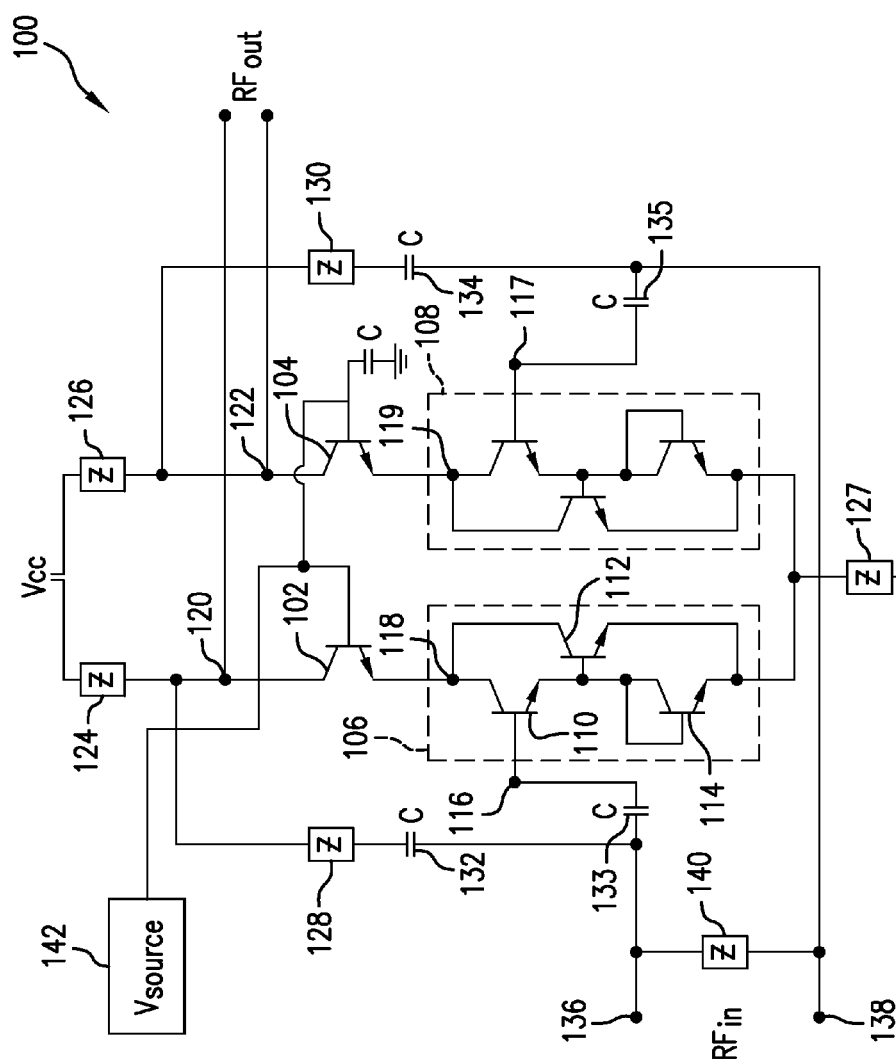
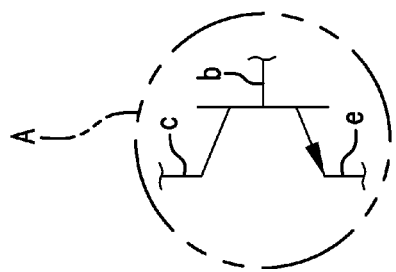
FIG. 1A
FIG. 1B

US 8,994,451 B1

RF AMPLIFIER

This application claims priority to claims priority to U.S. application Ser. No. 13/438,544 filed Apr. 3, 2012, the entirety of which is incorporated by reference herein.

BACKGROUND OF THE INVENTION

This invention relates to radio communications, and more specifically to radio frequency (RF) amplification in RF equipment.

Radio Frequency (RF) power amplifiers are used as components in many communication devices, including many wireless communication devices, including base stations and mobile devices. Power amplifiers typically increase voltage or current of an input signal. A measure of the amplification level often used is gain, which is typically measured in decibels ("dB").

It is critical in RF power amplifiers to have linear gain and consistent phase throughout the dynamic range in order to preserve the information being amplified. However, at very high frequencies, relative to a transistor-technology's frequency capability, typical power amplifier topologies have significant phase distortion as the output level approaches its maximum level. RF power amplifiers employ expensive transistors with better frequency capability and gain linearity throughout a higher dynamic range to compensate for the phase distortion.

SUMMARY

According to the present invention, there is provided an RF amplifier suitable for use in an RF transceiver. The circuit includes a first transistor pair, with the collector of each transistor in the first transistor pair coupled to one of the two differential output nodes and the base of each transistor in the first transistor pair is coupled to a common node. A pair of Ft doublers is also provided. The transistor unity-gain frequency (Ft) is the frequency where the short circuit current gain of a common-emitter transistor falls to unity. The Ft doubler is a circuit modeled as a transistor that nearly doubles the Ft of a transistor technology. The collector of each of the Ft doublers is coupled to the emitter of one of the transistors in the first transistor pair. Each Ft doubler has an emitter coupled to a common node, and a base coupled to one of the differential input nodes. As such, the first transistor pair and the Ft doubler pair are cascode-coupled to provide a wide bandwidth, high gain, and high input impedance RF amplifier.

A pair of impedance networks is provided in series with the collectors of the first transistor pair. The impedance networks are sized to cancel substantially a parasitic capacitance that arises between the base and the collector of each Ft doubler. A second impedance network is coupled between the two differential input nodes for impedance matching with other circuits in the system.

In another embodiment, a broadband amplifying circuit is provided. A pair of Ft doublers is cascode-coupled to a differential transistor pair. Each Ft doubler includes a second transistor having a base coupled to a differential input node. A third transistor has a collector coupled to the emitter of the second transistor, an emitter coupled to a common node, and its base and collector coupled. A fourth transistor has a collector coupled to the collector of the second transistor, a base coupled to the emitter of the second transistor and the collector of the third transistor, and an emitter coupled to the emitter of the third transistor and to the common node.

In another embodiment, there is provided an RF radio that includes an RF amplifier having a first transistor pair with each transistor in the first transistor pair having an emitter, a collector coupled to one of two differential output nodes, and a base coupled to a common node. An Ft doubler pair is provided with each Ft doubler having a collector coupled to the emitter of one of the transistors in the first transistor pair, an emitter coupled to a common node, and a base coupled to one of two differential input nodes.

These and other aspects, features, and advantages of the invention will become apparent upon review of the following description taken in connection with the accompanying drawings. The invention, though, is pointed out with particularity by the appended claims.

BRIEF DESCRIPTION OF THE DRAWINGS

FIG. 1A is a schematic diagram of an RF amplifier in accordance with the present invention.

FIG. 1B is symbol of a bipolar junction transistor found in the RF amplifier of FIG. 1.

DESCRIPTION OF THE PREFERRED EMBODIMENTS

FIG. 1A shows a schematic of a differential RF amplifier 100. The amplifier 100 has a pair of transistors 102 and 104 each cascode-coupled to one of two Ft doublers 106 and 108. FIG. 1A shows a typical transistor used in amplifier 100 with a collector "c", a base "b", and an emitter "e". The transistors employed in amplifier 100 are bipolar transistors, such as bipolar junction transistor (BJT) or heterojunction bipolar transistor (HBT) constructed with various fabrication technologies, including on a semiconductor substrate, such as silicon (SI) substrate, silicon-germanium (Si—Ge) substrate, gallium-arsenide (GaAs) substrate, or gallium-nitride (GaN) on silicon substrate.

Cascode coupling refers to two-stage amplification that extends the available bandwidth of the overall amplification stage. The first stage of the cascode-coupling, the input stage, includes a transistor with its emitter coupled to a common node, which may or may not be ground. The common-emitter stage has high input impedance and low voltage gain because its collector output drives into the low impedance of the emitter of the transistor in the second stage. The second stage, the output stage, includes a transistor with its base coupled to the common node. The common-base stage provides low input impedance for the common-emitter stage, which reduces its voltage gain and Miller Capacitance effect to extend the overall gain and bandwidth of the amplifier. Cascode-coupling of two amplification stages advantageously provides a wide bandwidth, high gain, and high input impedance.

Figure 2:
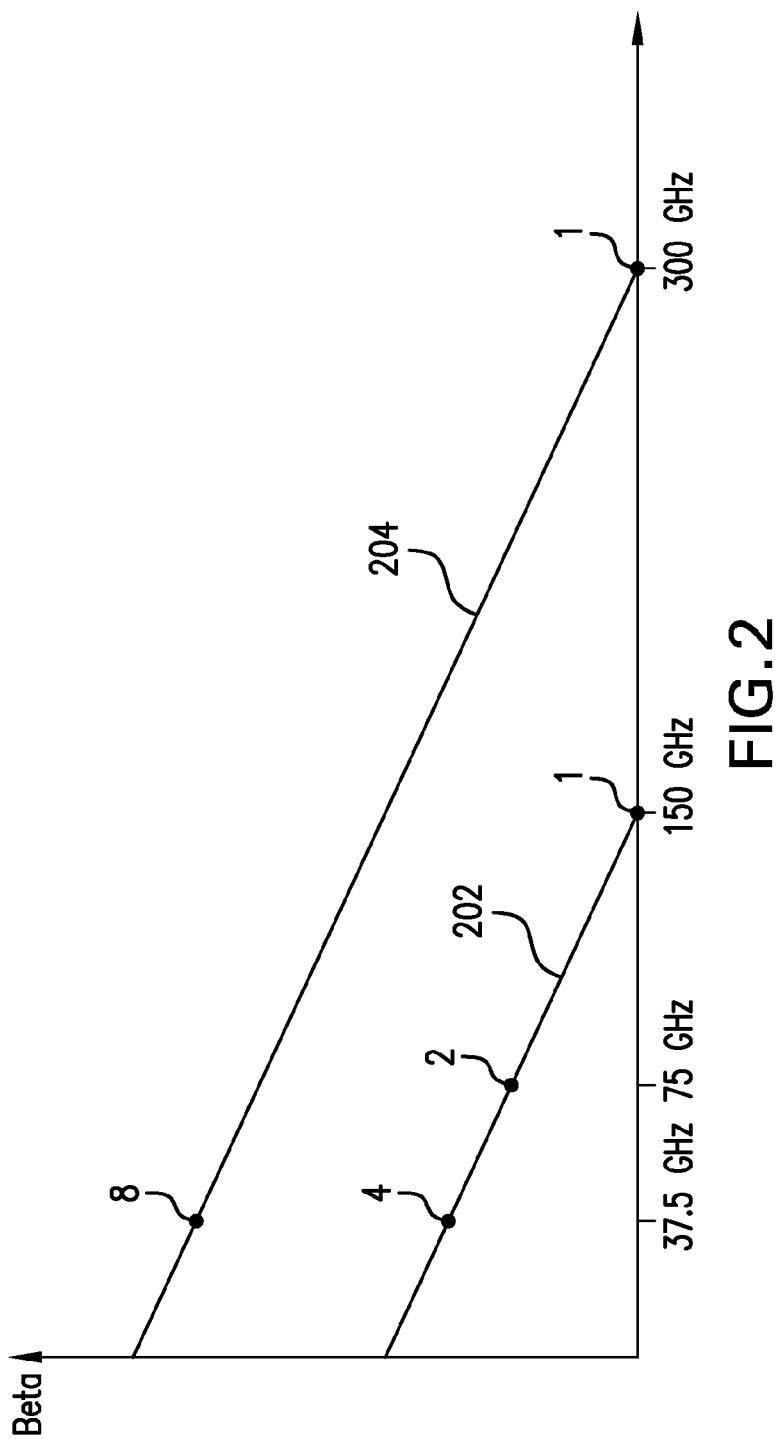
FIG. 2 is an AC short circuit current gain graph comparing the response of a bipolar junction transistor with the response of the Ft doubler bipolar transistor unit cells configured in the RF amplifier of FIG. 1A.

The transistor unity-gain frequency or frequency transition (Ft) is the frequency where the short circuit current gain of a common-emitter transistor falls to unity. The Ft doubler is a circuit modeled as a transistor that nearly doubles the Ft of a transistor technology. FIG. 2 shows the beta (β) (i.e., the ratio of the collector current and the base current or referred to as the current gain) versus frequency response (line 202) of a commercially available 150 GHz process SiGe HBT, and the beta versus frequency response (line 204) of the same HBT transistors configured as an Ft doubler. Line 202 shows the frequency of the unity current gain (i.e., β=1) is at 150 GHz while β=4 is at 37.5 GHz. Line 204 shows the frequency of the unity current gain is at 300 GHz while a β=8 is at 37.5 GHz. In the preferred embodiment, amplifier 100 operates around 30 GHz, which means the Ft doubler increases beta or the gain from a little more than 4 to a little more than 8, which is a considerable increase in high-frequency amplification capability. It also increases the input impedance at the base due to the higher effective beta.

In Ft doubler 106, a transistor 110 and a transistor 112 are Darlington-connected, and between a base and an emitter of transistor 112, a diode-connected transistor 114 is connected in parallel. The base of transistor 110 is an input terminal 116 and the collectors of transistors 110 and 112 become an output terminal 118 of FT doubler 106. Ft doubler 108 has an identical arrangement of transistors.

Ft doublers 106 and 108 can each be treated as a single transistor unit super-cell, and in that regard, Ft doublers 106 and 108 each form the enhanced common-emitter first-stage of the cascode-coupled differential RF amplifier 100. Ft doublers 106 and 108 are coupled to RF input ports 116 and 117. Ft doublers 106 and 108 raise the impedance at input terminals 116 and 117, which extends the useable frequency of operation and the level of power saturation where acceptable input impedance is maintained for high-frequency operation, and significantly increases the maximum RF gain per stage for a given transistor technology.

The differential output signal from Ft doublers 106 and 108 is delivered to output terminals 118 and 119, which is coupled to the second, common-base, stage of the cascode-coupled amplifier 100. The second stage includes common-base transistors 102 and 104, which provides a low-impedance interface to reduce voltage gain and the Miller Capacitance effect for Ft doublers 106 and 108, which further extends operating gain and bandwidth. The collectors of transistors 102 and 104 are coupled to RF output ports 120 and 122 of amplifier 100, respectively.

Cascode-coupling transistors 102 and 104 with Ft doublers 106 and 108, respectively, increase the bandwidth, gain, and phase linearity as amplifier 100 is operating in compression at these substantially high frequencies relative to the transistor technologies capability. The improved overall phase linearity of amplifier 100, compared to a standard cascode amplifier, occurs from the higher-starting input impedance and gain. Ft doublers 106 and 108 have a significantly higher starting input impedances and gain than a single transistor, so they will maintain higher impedances while amplifier 100 is operating in compression and cause less phase distortion.

As amplifier 100 enters compression, the high gain and high input impedance of Ft doublers 106 and 108 reduces and alters the parasitic capacitances. Compression also causes the impedance and parasitic capacitance in common-base transistors 102 and 104 to change. The bases of transistors 102 and 104 have low common mode impedance terminations, which minimizes their effective impedance change due to compression. The impedance at the collectors of transistors 102 and 104 is minimized by setting the output choke inductance of impedance networks 124 and 126, so they resonate slightly above the intended operating frequency with the small signal parasitic capacitance of transistors 102 and 104. This means output nodes 120 and 122 appear slightly inductive at the desired output frequency for small signal conditions and swing through the real axis before entering the capacitive region. This maintains output nodes 120 and 122 closer to real impedance for more compression range.

Additionally, some negative feedback adds linearity and RF gain and matching control for amplifier 100. A pair of capacitors 133 and 135 are connected in series between differential input nodes 136 and 138, respectively, and Ft doublers 106 and 108, respectively, to block DC currents.

A pair of impedance networks 124 and 126 is coupled between output ports 120 and 122 of amplifier 100 and a power-supply voltage (Vcc). Another impedance network 127 is coupled between Ft doublers 106 and 108 and ground. Impedance network 127 is sized to have high impedance at operating frequencies to maintain good common mode rejection characteristics and maximizes voltage overhead by providing a DC short for the amplifier current.

Impedance networks 124, 126, 127 and 140 are reactive elements sized to resonate near the design frequency of operation for the amplifier, and can be a combination of resistors (R), inductors (L), or capacitors (C) sized and arranged in series or parallel depending on the design characteristics of amplifier 100; for example, impedance networks 124, 126, 127 and 140 can be configured as a parallel LC or RLC circuit.

A series-connected inductor 128 and a capacitor 132 are coupled between output port 120 and an RF input port 136 of amplifier 100. A corresponding series-connected inductor 130 and a capacitor 134 are coupled between output port 122 and an RF input port 138 of amplifier 100. Inductors 128 and 130 and capacitors 132 and 134 are sized to provide desired RF gain and impedance control with minimal impact to overall output power capability.

The operating range for amplifier 100 is maintained by providing a sufficient overhead voltage to the second stage, the output stage of amplifier 100. This sufficient overhead voltage is supplied by a voltage source 142 to the common-base of transistors 102 and 104.

Figure 3:
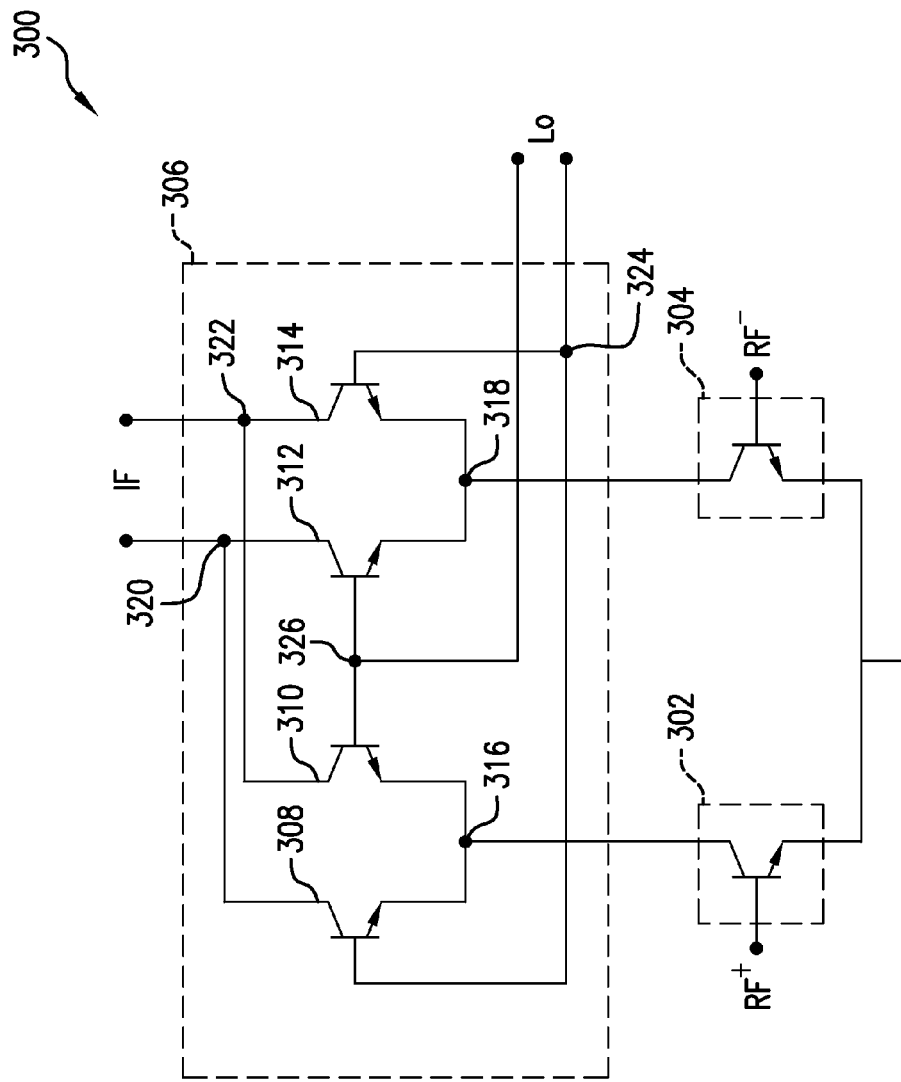
FIG. 3 is a schematic diagram of an RF mixer in accordance with the present invention employing a pair of Ft doubler unit cells to extend the frequency capability of a standard RF mixer.

Ft doublers are useful in many high-frequency RF applications where gain is required. FIG. 3 shows, for example, two Ft doublers 302 and 304, each represented as a single transistor unit cell, coupled to an RF mixer quad core 306. Mixers are often used for up-converting an intermediate frequency (IF) signal to a high-frequency signal or down-converting a high-frequency signal to an IF signal and may be used in both frequency conversion and frequency synthesis applications. Differential RF amplifier 100 can be modified for use in many types of mixers, such as unbalanced, single and double balanced mixers.

Ft doublers 302 and 304 are effectively cascode-coupled to the quad core 306, thereby creating an active double balanced mixer, i.e. a mixer with gain. Mixer 306 includes dual pairs of transistors 308-310 and 312-314. The emitter of dual transistor pairs 308-310 and 312-314 are coupled at terminals 316 and 318, respectively. The collectors of transistors 308 and 312 are coupled at terminal 320, and the collectors of transistors 310 and 314 are coupled at terminal 322. The bases of transistors 308 and 314 are coupled at terminal 324, and the bases of transistors 310 and 312 are coupled at terminal 326.

Mixer 306, when functioning in a receiver, has a differential RF input applied to the emitters of dual transistor pairs 308-310 and 312-314 that is provided by Ft doublers 302 and 304. A differential local oscillator signal is applied to the bases of dual transistor pairs 308-310 and 312-314 at terminals 324 and 326, respectively. A differential intermediate frequency output signal is provided by the collectors of dual transistor pairs 308-310 and 312-314, respectively, at terminals 320 and 322, respectively.

Dual transistor pairs 308-310 and 312-314 function essentially as a common-base stage of a cascode amplifier, whereas Ft doublers 302 and 304 function as the first, common-emitter stage.

Various implementations of the disclosed embodiments may be incorporated into a portable communications device such as an RF transmitter-receiver of a mobile device, a personal communications service (PCS) phone, a wireless local area network (LAN) transmitter-receiver, etc.

Figure 4:
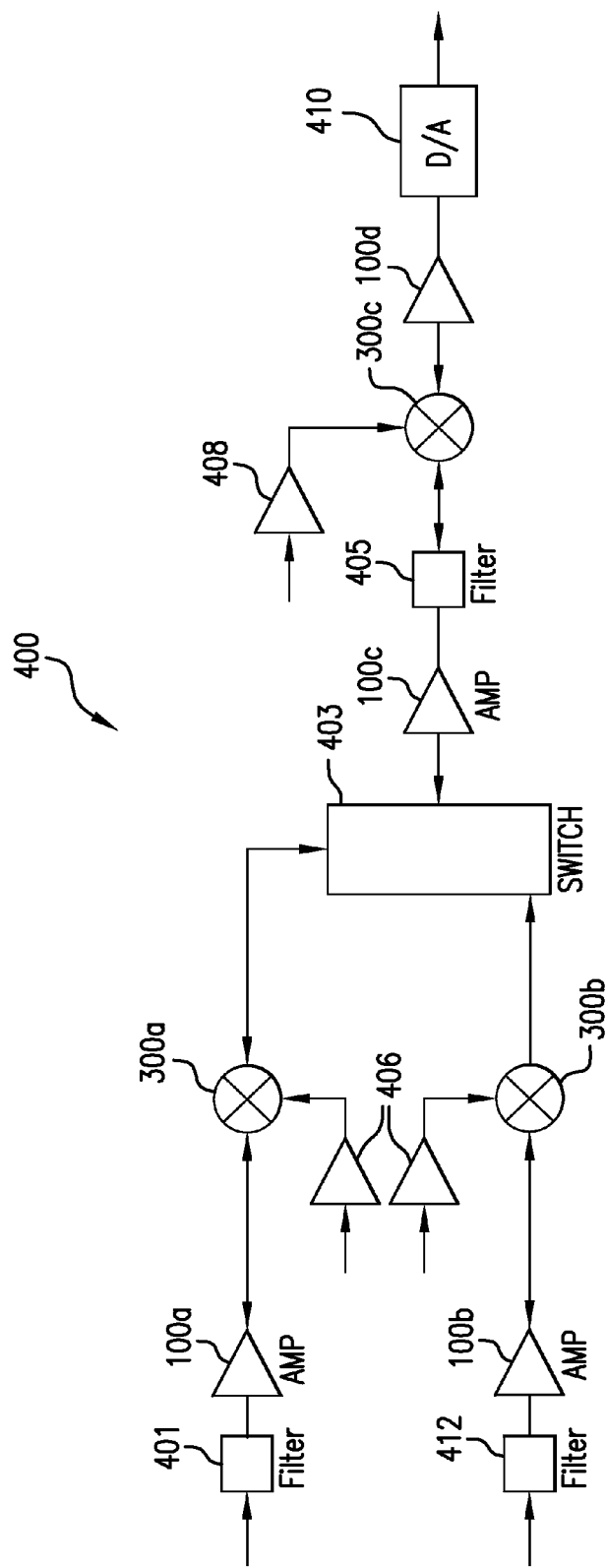
FIG. 4 is a schematic of a portion of an exemplary signal processing system in which the circuits of FIGS. 1 and 3 may be incorporated.

FIG. 4 discloses an embodiment of a signal-processing circuit 400 found in such devices, as incorporating various RF amplifiers 100 (as 100a-d) and RF mixers 300 (as 300a-c). An RF signal is received and filtered in a filter 401 and amplified by a low-noise amplifier circuit 100a. The amplified signal is combined with a local oscillator (LO) signal from an LO circuit 406 in a mixer 300a. A corresponding RF signal is similarly filtered and amplified by filter 412 and amplifier 100b and down-converted in mixer 300b. One or more variations of the mixed signals from mixers 300a and 300b is selected by a switch 403, after which it is amplified by an amplifier 100c and filtered by filter 405. The amplified, filtered signal is then combined with another LO signal from an LO circuit 408 by a mixer 300c, then amplified by amplifier 100d and changed into a digital signal by digital-to-analog converter 410, where after it can be subsequently processed. One skilled in the art would recognize that the above is only one example of what can be done and that there are many signal processing functions that can be performed on an RF signal, depending upon the specific use of the signal-processing circuit 400.

Use of an Ft doubler in an Rf circuit to improve phase linearity is counter-intuitive. Increasing the nodes (i.e. junctions between components) in an amplifier or mixer topology decreases the linear performance of the circuit when the circuit is operating at frequencies substantially lower than where the parasitic capacitances begin limiting the operation of the device. A typical cascode-connected amplifier has twice the junctions of a single transistor amplifier; however, the cascode-connected amplifier, at high frequencies, has better linearity than the single transistor amplifier. The super-cell Ft doubler in a cascode configuration, similarly has better linearity in high-frequency operations. The Ft doubler cascode has four transistors, whereas a cascode amplifier has just two transistors (doubled for a differential configuration), which explains why the cascode amplifier has previously been preferred in high frequency RF applications.

While the present invention has been particularly shown and described with reference to exemplary embodiments thereof, it should be understood by those of ordinary skill in the art that various changes, substitutions and alterations can be made herein without departing from the scope of the invention as defined by appended claims and their equivalents.

What is claimed:

1. An RF amplifier, comprising:
   a first transistor pair, each transistor having an emitter, a collector coupled to one of two differential output nodes, and a common base; and
   an Ft doubler pair, each Ft doubler having a collector coupled to the emitter of one of the first transistor pairs, a common emitter, and a base coupled to one of two differential input nodes;
   a pair of first impedance networks, wherein each impedance network is coupled in series with the collector of one of the transistors in the first transistor pair, and wherein the pair of first impedance networks are sized to substantially cancel a parasitic capacitance that arises between the base and the collector of each Ft doubler; and
   a second impedance network coupled between the two differential input nodes.

2. An RF amplifier, comprising:
   a first transistor pair, each transistor having an emitter, a collector coupled to one of two differential output nodes, and a common base; and
   an Ft doubler pair, each Ft doubler having a collector coupled to the emitter of one of the first transistor pairs, a common emitter, and a base coupled to one of two differential input nodes, wherein each Ft doubler further comprises:
   a second transistor having a base coupled to one of the differential input nodes, a collector, and an emitter;
   a third transistor having a collector coupled to the emitter of the second transistor, a base coupled to the collector of the third transistor, and an emitter coupled to a common node; and
   a fourth transistor having a collector coupled to the collector of the second transistor, a base coupled to the emitter of the second transistor and the collector of the third transistor, and an emitter coupled to the emitter of the third transistor and to the common node.

3. The RF amplifier of claim 2, wherein the first transistor pair and the Ft doubler pair are arranged in cascode with the base of each transistor in the first transistor pair being coupled to a common node and the emitter of each of the Ft doublers being coupled to the common node.

4. The RF amplifier of claim 2, wherein each Ft doubler and the first transistor pair include silicone-germanium (SiGe) transistors.

5. The RF amplifier of claim 2, wherein each one of the transistors in the first transistor pair is coupled to the fourth transistor in the Ft doubler in cascode.

6. The RF amplifier of claim 5, and further comprising a fifth transistor pair arranged in a ring with the first transistor pair, wherein the ring includes a first differential input node coupled to the Ft doubler pair, a second differential input node adapted to receive a local oscillator signal; and a third differential output node adapted to provide a mixed signal.

7. An RF amplifier, comprising:
   a first stage including an Ft doubler having a collector, a base connected to an input node, and a common emitter; and
   a second stage including an Ft doubler having an emitter connected to the collector of the Ft doubler of the first stage, a common base, and a collector connected to an output node; and
   wherein each Ft doubler further comprises a first transistor, a second transistor, and a third transistor each include an emitter, a base, and a collector, wherein the collector of the first transistor is connected to the collector of the second transistor and the emitter of the first transistor is connected to the base of the second transistor, and wherein the collector of the third transistor is connected to the base of the second transistor, the base of the third transistor is connected to the base of the second transistor, and the emitter of the second transistor is connected to the emitter of the third transistor.

8. The RF amplifier of claim 7, and further comprising a first impedance network connected in series with the second stage for substantially canceling a parasitic capacitance arising between the base and the collector of each Ft doubler.

9. The RF amplifier of claim 8, and further comprising a second impedance network connected to the input node.

10. An RF Amplifier comprising:

an Ft doubler for increasing an input signal, the Ft doubler including a first transistor, a second transistor, and a third transistor each include an emitter, a base, and a collector, wherein the collector of the first transistor is connected to the collector of the second transistor and the emitter of the first transistor is connected to the base of the second transistor, and wherein the collector of the third transistor is connected to the base of the second transistor, the base of the third transistor is connected to the base of the second transistor, and the emitter of the second transistor is connected to the emitter of the third transistor.

11. The RF Amplifier of claim 10, and further comprising a first stage including the Ft doubler and a second stage connected to the first stage including an Ft doubler.

12. The RF Amplifier of claim 11, wherein the Ft doubler of the first stage has a collector, a base connected to an input node, and a common emitter, and wherein the Ft doubler of the second stage has an emitter connected to the collector of the Ft doubler of the first stage, a common base, and a collector connected to an output node.

13. The RF Amplifier of claim 12, and further comprising a first impedance network connected in series with the second stage for substantially canceling a parasitic capacitance arising between the base and the collector of each Ft doubler.

14. The RF Amplifier of claim 13, and further comprising a second impedance network connected to the input node.

15. The RF Amplifier of claim 10, and further comprising a fourth transistor having a collector connected to an output node and a common base, and an emitter connected to the collector of the first transistor.

16. The RF Amplifier of claim 15, and further comprising a first stage including the first transistor, the second transistor, and the third transistor, and a second stage connected to the first stage including the fourth transistor.

17. The RF Amplifier of claim 16, wherein each transistor in the first stage and the second stage includes silicone-germanium (SiGe) transistors.

* * * * *